(12) United States Patent
Dahlen et al.

(10) Patent No.: US 6,224,395 B1
(45) Date of Patent: May 1, 2001

(54) FLEX CABLES WITH INCREASED THREE-DIMENSIONAL CONFORMITY AND DESIGN FLEXIBILITY

(75) Inventors: Paul E. Dahlen; John R. Dangler, both of Rochester; Thomas D. Kidd, Stewartville; Miles F. Swain, Hayfield, all of MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 08/864,313

(22) Filed: May 28, 1997

(51) Int. Cl.[7] .................................................. H01R 12/08
(52) U.S. Cl. .............................................. 439/67; 439/77
(58) Field of Search ............................. 439/67, 492, 77; 174/74 R, 72 A, 117 FF

(56) References Cited

U.S. PATENT DOCUMENTS

| | | | |
|---|---|---|---|
| 3,818,122 | * 6/1974 | Luetzow | 439/492 X |
| 3,836,415 | * 9/1974 | Hilderbrandt | 174/72 A X |
| 4,065,199 | 12/1977 | Andre et al. | . |
| 4,251,683 | * 2/1981 | Oughton, Jr. et al. | 174/74 ROR |
| 4,871,315 | 10/1989 | Noschese | 439/67 |
| 4,954,100 | * 9/1990 | McCleerey | 439/492 |
| 5,163,835 | * 11/1992 | Morlion et al. | 439/67 OR |
| 5,197,902 | * 3/1993 | Cesar | 439/492 OR |
| 5,675,888 | * 10/1997 | Owen et al. | 439/77 X |
| 6,010,357 | * 1/2000 | Kunishi | 439/77 X |

FOREIGN PATENT DOCUMENTS

| | | |
|---|---|---|
| 52-129987 | 10/1977 | (JP) . |
| 62-082607 | 4/1987 | (JP) . |
| 3179617 | 8/1991 | (JP) . |
| 406085409 | 3/1994 | (JP) . |

OTHER PUBLICATIONS

James J. Dilliplane, "A New Concept for Connecting Flat Flexible Cables," Insulation/Circuits, Jul. 1972, pp. 26–29.

* cited by examiner

*Primary Examiner*—Renee Luebke
(74) *Attorney, Agent, or Firm*—Felsman, Bradley, Vaden, Gunter & Dillon, LLP

(57) ABSTRACT

A flex cable is slit between conductor traces to provide conformable strips, at least one of which can be flipped to expose one of the conductor traces to the other side of the cable. This increases the design flexibility of the flex cable because the conductor traces can be exposed on both sides of the cable without laser ablation or etch operations to remove the substrate. Also, because the flex cable is slit along its length, it is more able to conform to different connector locations, thereby obviating the need for designing a different flex cable to accommodate changes in mating hardware.

3 Claims, 3 Drawing Sheets

FLEX CABLES WITH INCREASED THREE-DIMENSIONAL CONFORMITY AND DESIGN FLEXIBILITY

BACKGROUND OF THE INVENTION

1. Field of the Invention

The present invention generally relates to electrical connectors and, more particularly, to a flexible interconnect cable having improved design flexibility and three-dimensional conformity.

2. Description of the Related Art

Thin, flexible cables for interconnecting electrical devices are well-known in the art. These articles, variously referred to as flex cables, flex circuits, flex circuit cards, or flex cable assemblies, are particularly useful for carrying electrical signals in compact electronics applications. In the computer industry, cable assemblies are used for many purposes including power distribution, low-speed signal communication, and high-speed signal communication. For example, in high-performance computer systems, specialized cable assemblies are used to transmit high-speed signals from one processor to another processor, from a processor to system memory (RAM), or from a processor to an input/output (I/O) device. These specialized high-speed cable assemblies are mechanically and electrically connected to the printed circuit boards that support these components.

A typical flex cable has many conductive traces (thin conductive layers) placed on an insulative substrate, in a pattern appropriate for the particular interconnection, to form an elongated and flexible circuit structure. The conductive traces can be formed of any conductive material, as gold or copper, and the substrate can be any flexible material, usually a durable polymer, including polyester or polyimide, such as MYLAR or KAPTON, flexible insulation films. The conductors can be coated with an overlying layer of insulative material or hermetically sealed. Electrical contacts (or pads formed on the conductive traces) are provided at the ends of and along the conductive traces, including signal and ground plane contacts.

Interconnection with the contacts or pads formed on the flex cable may be provided in a temporary manner, e.g., using a switch or other mechanism that results in a physical wiping action by a component contact to achieve connection with the flex cable contact, or in a permanent manner, e.g., soldering. The contacts may be provided for through hole connection or surface-mount connection. A flex cable can have a multi-layer construction, i.e., conductive traces and contacts on upper and lower surfaces of the substrate or buried in the substrate. More complicated three-dimensional conductive traces can be constructed by, e.g., laser ablation or etching operations. Multiple flex cables can be used in parallel, stacked, and staggered assemblies.

FIG. 1 depicts a conventional flex cable design 10 for interconnecting a computer system to a CD-ROM (compact disk, read-only memory) device. Flex cable 10 includes a plurality of conductive traces 12 formed on an insulative substrate 14. The conductive traces terminate in through-holes 16 which have been plated with a conductive material. Two sets of holes define first and second connectors 18 and 19 at one end of the cable, and a third set of holes defines a third connector 20 at the other end of the cable. A fourth set of holes defines a fourth connector 22 at the end an extension 24 integrally formed with substrate 14. Conductive traces may be provided on the underside of the substrate (not shown) for connection to, e.g., the fourth connector 22.

The propagation delay for high-speed signals between electronic components affects overall performance of the computer system, so the propagation delay is decreased by reducing the total path length for the signal to travel, as well as by improving the dielectric properties of the cable assemblies. Reducing the path length is also generally desirable to provide more compact systems. Using shorter flex cables can, however, introduce other problems. Short flex cables have some ability to conform along the length of the flex but little flexibility perpendicular to the cable surface; for example, the flex cable 10 of FIG. 1 can easily flex (or bow) between the ends at connectors 18 and 20, but it has little ability to conform in the left-right direction. The ability to accept rotation from connector to connector is thus limited by the bending characteristics of the flex cable. Cable stiffness places stresses on the flex cable assembly and mating hardware when flex is bent or any dimensional mismatch occurs, and so can lead to defects if sufficient tolerance is not provided, and limits packaging density.

Because of the foregoing limitations, different cable designs are made to fit each application. For example, even with a single product, a first cable may be needed for system test, and a second cable needed for manufacturing volumes. Cable and hardware stresses are reduced by altering the construction of the cables, but this impacts electrical performance, presenting additional tolerances must be considered. Cable routings must also be based on standard flex characteristics. It, therefore, would be desirable to design a flex cable having improved physical conformity to lessen tolerance demands. It further would be advantageous if the improved flex cable provided increased interconnection design flexibility for additional functionality.

SUMMARY OF THE INVENTION

It is therefore one object of the present invention to provide an improved flex cable, particularly one that is adapted to interconnect computer components.

It is another object of the present invention to provide such a flex cable having improved physical conformity, particularly in three dimensions.

It is yet another object of the present invention to provide such a flex cable which can be used in a wider variety of interconnection designs, including interconnections on both sides of the cable.

The foregoing objects are achieved in a flex cable generally comprising an electrically insulative, flexible, generally planar substrate having a first (upper) surface and a second (lower) surface, and conductor traces formed on at least the first surface of the substrate, the substrate having a plurality of slits located to provide at least one conformable strip for supporting one of the conductor traces. In one embodiment of the flex cable, portions of the slits are skewed with respect to a lengthwise direction of the cable. The slit flex can reduce forces on the cable and mating hardware and reduce torsional force for dynamic or static applications. Jumper tabs can be used to interconnect ground planes at the slits. A portion of the conformable strip may be twisted such that the supported conductor trace faces away from a normal to the first surface, e.g., that portion of the strip can be twisted approximately 180° to face the same direction as the second surface. The strip can have another conductor trace formed on the second surface of the substrate which is exposed at twisted portion toward the first surface. Contacts can be formed on the supported conductor trace at the twisted portion to create connections. The strip further can have a second portion which is also twisted such that the supported conductor trace at the second portion also faces away from the normal to the first surface, providing multiple contact points along the conductor trace facing the same direction as the second surface. Slitting of the trace strips in this manner allows a single flex cable to be easily adapted to different connector configurations. Twisting allows interconnection through the substrate without laser ablation or etch operations.

The above as well as additional objectives, features, and advantages of the present invention will become apparent in the following detailed written description.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein:

DESCRIPTION OF THE PREFERRED EMBODIMENT

Figure 1:
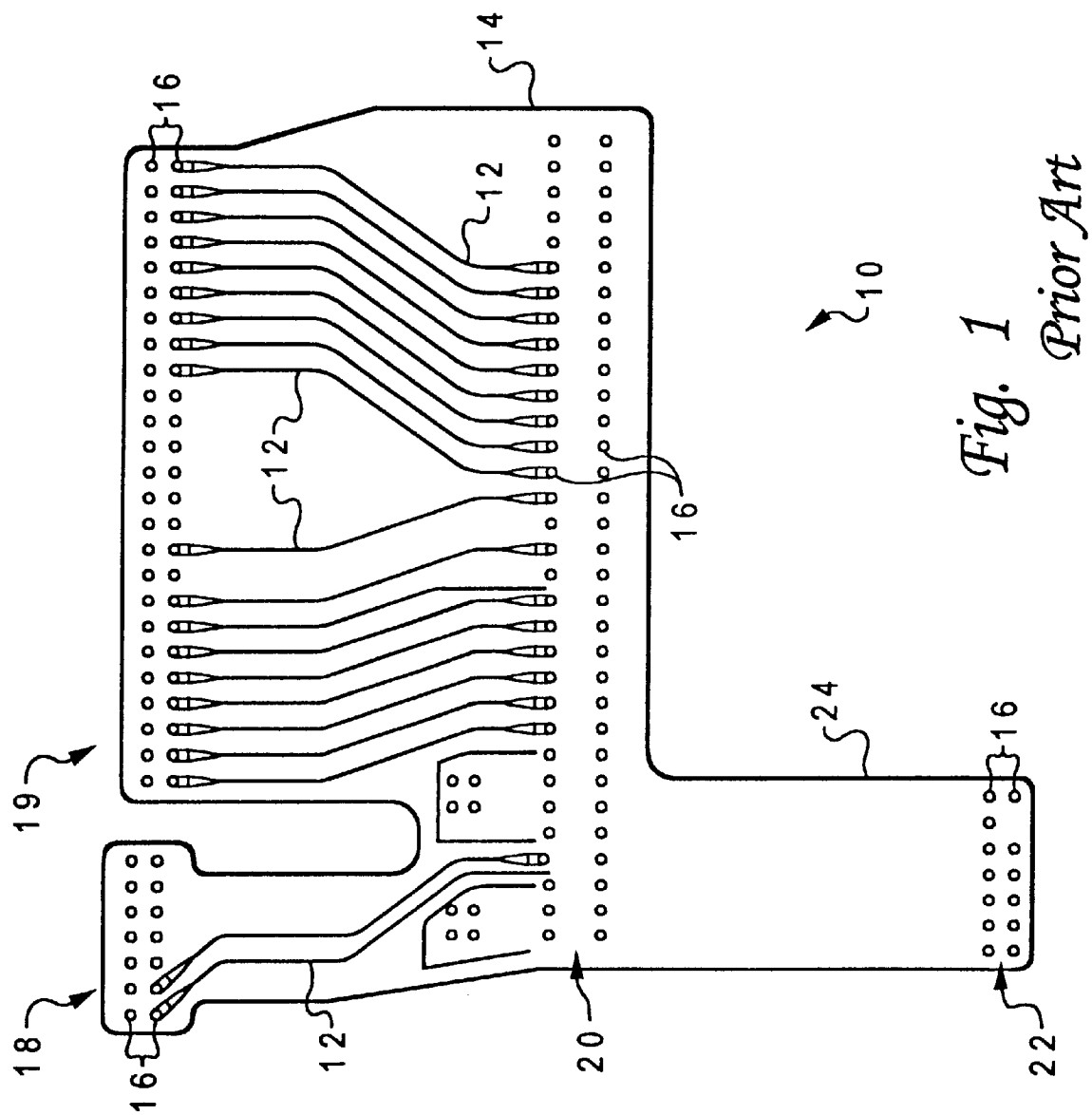
FIG. 1 is a top plan view of a prior-art flex cable.
Figure 2:
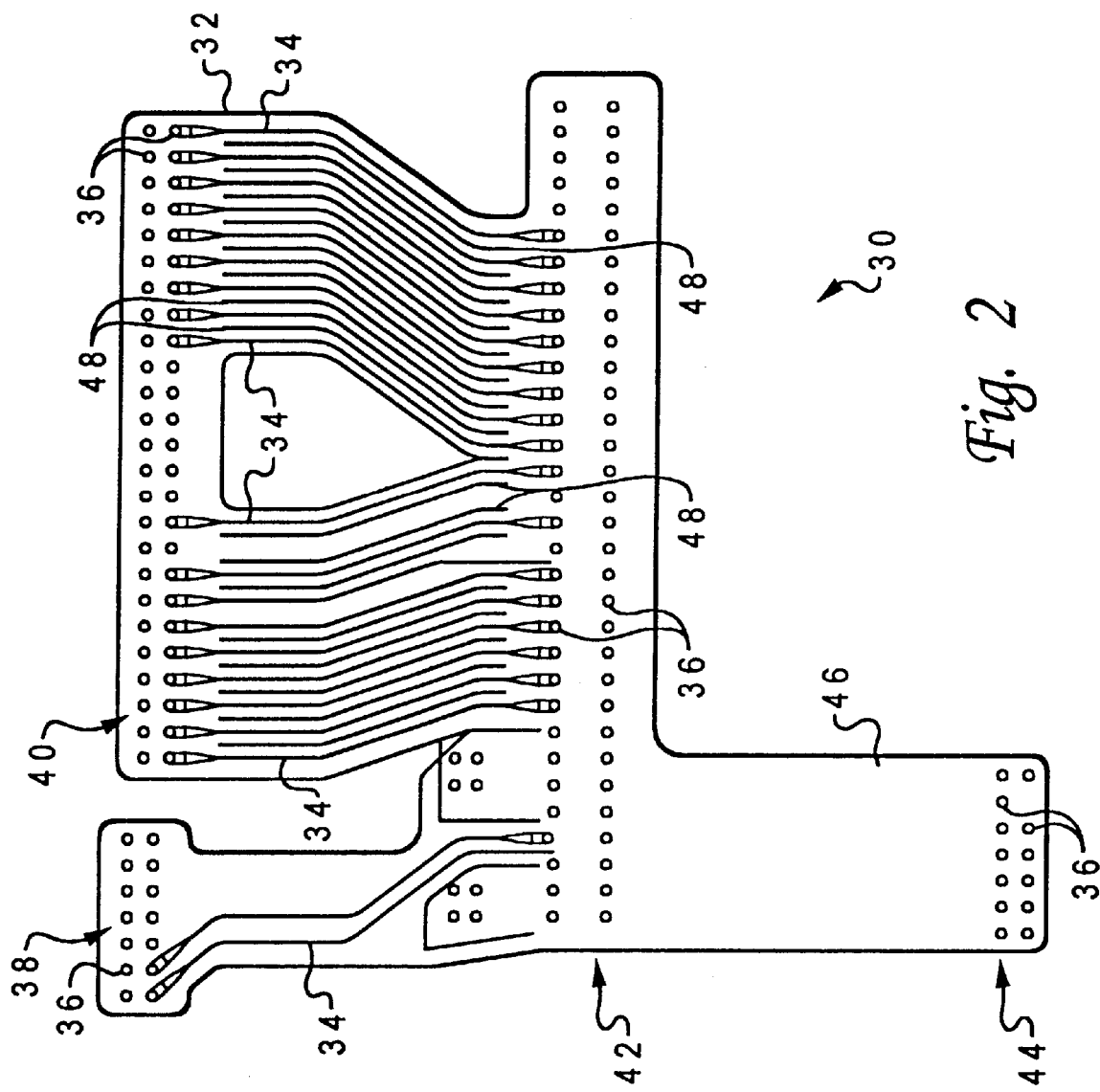
FIG. 2 is a top plan view of one embodiment of a flex cable constructed in accordance with the present invention, having slits between the conductive traces.

With reference now to the figures, and in particular with reference to FIG. 2, there is depicted one embodiment 30 of a flex cable constructed in accordance with the present invention. Flex cable 30 is particularly adapted to interconnect a computer system with a CD-ROM device, and includes an electrically insulative, generally planar substrate 32 having a plurality of conductive traces 34 formed on one surface thereof. Each conductive trace 34 terminates in an electrical contact 36 which, in the depicted embodiment, is a plated through-hole. Two sets of contacts define first and second connectors 38 and 40 at one end of the cable, and a third set of contacts defines a third connector 42 at the other end of the cable. A fourth set of contacts defines a fourth connector 44 at the end of an extension 46 integrally formed with substrate 32. Conductive traces may be provided on the underside of the substrate (not shown) for connection to, e.g., the contacts forming connector 44.

Substrate 32 may be any durable, flexible material, preferably a polymer such as polyester or polyimide, particularly Kapton. Traces 34 may be formed of any conductive material, such as copper, and any exposed pads may further be coated with a layer of solder or nickel-gold for a wire bond. The dimensions of cable 30 may vary depending upon the application, but exemplary dimensions are an overall length of about 4" (10 cm), a width of about 2" (5 cm), and a substrate thickness of about 0.012"–0.015" (0.30 mm–0.38 mm).

Several slits 48 are cut into substrate 32, particularly in between the conductive traces 34, forming a plurality of substrate strips which partially support the conductive traces. Providing slits allows the cable to flex in three dimensions, i.e., not only by bowing between the two ends of the cable, but also by buckling and shifting the strips to provide flexibility perpendicular to the cable surface. This improved bending ability of cable 30 thus accepts larger rotations from connector to connector. Slits 48, which generally extend the length of the conductive traces, do not necessarily extend completely parallel to flex cable 30, i.e., a portion of any given slit may be skewed with respect to the lengthwise direction defined by the two ends of the cable. This construction detail further augments the three-dimensional conformity of the cable. A single cable then can be used for more than one application. For example, depending on system electrical requirements, this approach can provide prototype hardware for testing or finished product hardware, or a single cable might be usable with two different devices, e.g., two different CD-ROMs, and so would reduce the number of cables required for these two products from two to one.

The slit flex can reduce forces on the cable and mating hardware and reduce torsional force for dynamic or static applications. Slits can be formed in the final part outline die or as a separate step in the manufacturing process; placing the slit cutters in the final die would eliminate extra steps. Non-critical signals (i.e., ground plane) could be slit through, or the ground plane could be terminated adjacent to the slit area. By grouping adjacent lines, ground planes could be extended further beyond the edge of the signal lines to improve electrical performance. Jumper tabs from slit to slit can provide improved electrical performance for ground plane applications by improving the return path and better controlling the orientation of the individual slits when flex cable 30 is installed. Slit location may vary considerably depending upon the particular design, but would likely occur through the bulk of the cable and not just at the connector points (ends).

Figure 3:
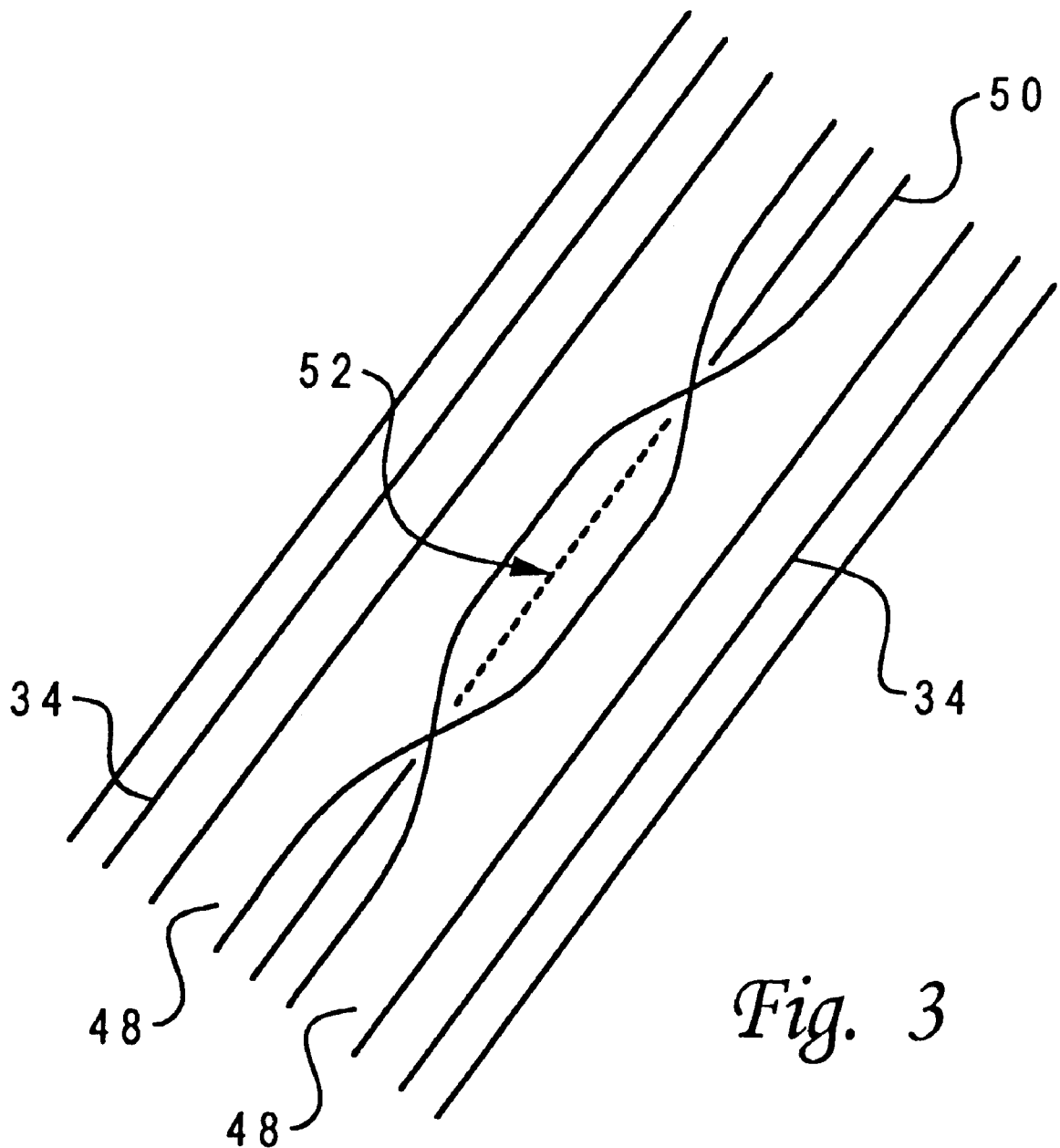
FIG. 3 is a perspective view depicting how a strip of the substrate of the flex cable of FIG. 2 supporting a conductive trace can be flipped.

With further reference to FIG. 3, another advantage in the use of slits 48 is the ability to flip (rotate or twist) the strips to increase design flexibility. FIG. 3 show one strip 50 having a portion which has been rotated approximately 180° such that the conductive trace on that portion of the strip faces the lower surface of the substrate, instead of facing up. A contact or pad 52 can be formed on this flipped portion of the trace. In this manner, on a "single-sided" flex cable (one in which the conductive traces are all initially applied to a single, first surface of the substrate), surface mount or ground pads could be exposed on both sides of the cable without laser ablation or etch operations. Slit flex can thus allow for packaging that would not be possible with a single wide piece of prior-art flex cable. The ability to use a single cable in this manner for more than one application eliminates the need for a different flex cable for testing, allowing the design to firm up other mechanical and electrical requirements (i.e., by material selection), such as reducing cable engineering change activity. Implementation on product hardware would reduce part number requirements and cable costs by increasing individual part number volumes.

In addition to flipping a strip in order to make contact between the conductive trace formed on the first (upper) surface and a contact facing the second (lower) surface, the strip could be flipped in order to simply avoid having the conductive trace make contact with something that might otherwise be abutting the upper surface at this location. Also, conductive traces may be provided on both sides of the cable, so that a strip can be flipped to provide interconnection between a trace formed on the lower surface and a contact located on the upper surface side of the cable.

While strip 50 is shown twisted a full 180° in FIG. 3, those skilled in the art will appreciate that this aspect of the invention can still be beneficial with less rotation, e.g., the portion of the strip might be twisted 90°, or twisted so that the conductive trace on this portion faces only slightly away from the normal to upper surface. Also, a given strip can be flipped at more than one location along its length to provide multiple contacts on both sides of the substrate.

The advantages of this invention over prior-art flex cables include increased functionality by providing additional design options, achieved by mechanical stress improvement, increased three-dimensional conformability, and the ability to open pads on the opposite side of the cable by flipping individual strips. The invention can provide for packaging solutions that are not possible with current flex cables, reduce tooling requirements or part number requirements, and allow for quicker procurement of hardware.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is therefore contemplated that such modifications can be made without departing from the spirit or scope of the present invention as defined in the appended claims.

What is claimed is:

1. A flexible cable, comprising:

an electrically insulative, generally planar substrate having first and second surfaces, and a plurality of conductive traces formed on at least the first surface;

an electrical contact at each end of each conductive trace;

slits in the substrate located between at least some of the conductive traces to form a plurality of substrate strips that at least partially support the conductive traces, wherein the slits allow the cable to flex in three dimensions; and wherein at least one of the substrate strips is rotated relative to the other substrate strips.

2. The flexible cable of claim 1 wherein said at least one of the substrate strips is rotated approximately 180 degrees relative to the other substrate strips such that the conductive trace on a rotated portion of said at least one of the substrate strips faces in a same direction as the second surface of the substrate.

3. The flexible cable of claim 2, further comprising a pad formed on the rotated portion of said at least one of the substrate strips.

* * * * *